US010652991B2

(12) United States Patent
Yamamoto et al.

(10) Patent No.: US 10,652,991 B2
(45) Date of Patent: May 12, 2020

(54) PLASMA PROCESSING APPARATUS AND MICROWAVE OUTPUT DEVICE

(71) Applicant: HITACHI HIGH-TECHNOLOGIES CORPORATION, Tokyo (JP)

(72) Inventors: Koichi Yamamoto, Hikari (JP); Atsushi Itou, Kudamatsu (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 331 days.

(21) Appl. No.: 15/670,194

(22) Filed: Aug. 7, 2017

(65) Prior Publication Data

US 2017/0367169 A1 Dec. 21, 2017

Related U.S. Application Data

(63) Continuation of application No. 13/787,950, filed on Mar. 7, 2013, now abandoned.

(30) Foreign Application Priority Data

Aug. 7, 2012 (JP) ................................ 2012-174523

(51) Int. Cl.
*H05H 1/46* (2006.01)
*H05B 6/68* (2006.01)
*C23C 16/00* (2006.01)

(52) U.S. Cl.
CPC ....... *H05H 1/46* (2013.01); *H05H 2001/4622* (2013.01); *H05H 2001/4682* (2013.01)

(58) Field of Classification Search
CPC ............ H05H 1/46; H05H 2001/4682; H05H 2001/4622; H01J 37/32146; H01J 37/32935; H01J 37/32192
USPC ....... 219/690, 694, 696, 702, 715, 716, 718, 219/760; 363/21.1, 56.09, 97, 23, 37, 75; 156/345.28; 118/723 MW, 723 ME
See application file for complete search history.

(56) References Cited

U.S. PATENT DOCUMENTS

| | | |
|---|---|---|
| 4,142,082 A | 2/1979 | Israel |
| 4,777,575 A | 10/1988 | Yamato et al. |
| 4,903,183 A | 2/1990 | Noguchi et al. |

(Continued)

FOREIGN PATENT DOCUMENTS

| | | |
|---|---|---|
| EP | 2221850 A1 | 8/2010 |
| JP | 1-232727 A | 9/1989 |

(Continued)

OTHER PUBLICATIONS

Tomohiko Mitani et al., Research and Development on Low-Noise Magnetron for Microwave Oven—Consideration on Time-Domain Analysis Experiments of Noises-, Technical Report of IEICE SPS2004-18 (Feb. 2005).

*Primary Examiner* — Quang T Van
(74) *Attorney, Agent, or Firm* — Baker Botts L.L.P.

(57) ABSTRACT

A plasma processing apparatus includes: a high voltage power supply for supplying a high voltage power to a magnetron; and a detector for detecting a microwave output from the magnetron, wherein based on a result of comparing a signal, which is obtained by adding an output from the detector to an AC component of a current detected from an output of the high voltage power supply, with a setting value of the output of the high voltage power supply, the output of the high voltage power supply is adjusted.

12 Claims, 6 Drawing Sheets

(56) References Cited

U.S. PATENT DOCUMENTS

| | | | | |
|---|---|---|---|---|
| 6,080,270 | A * | 6/2000 | Tabrez .............. | H01J 37/32229<br>118/723 ME |
| 6,184,687 | B1 | 2/2001 | Yamage et al. | |
| 7,902,991 | B2 | 3/2011 | Park et al. | |
| 7,931,776 | B2 | 4/2011 | Itabashi et al. | |
| 2004/0097089 | A1 | 5/2004 | Ohmi et al. | |
| 2010/0258529 | A1 | 10/2010 | Mori et al. | |
| 2011/0150719 | A1 | 6/2011 | Ikeda | |

FOREIGN PATENT DOCUMENTS

| | | | |
|---|---|---|---|
| JP | 2000-294396 | A | 10/2000 |
| JP | 2011-103270 | A | 5/2011 |

* cited by examiner

100

PLASMA PROCESSING APPARATUS AND MICROWAVE OUTPUT DEVICE

CROSS REFERENCE TO PRIOR APPLICATIONS

This application is a continuation of U.S. patent application Ser. No. 13/787,950, filed on Mar. 7, 2013, which claims benefit of priority to Japanese Application No. 2012-174523, filed on Aug. 7, 2012. The contents of the above applications are hereby incorporated by reference.

BACKGROUND OF THE INVENTION

The present invention relates to a plasma processing apparatus that processes a substrate-like material, such as a semiconductor wafer, arranged in a processing chamber inside a vacuum container by plasma that is formed using microwave supplied into this processing chamber, and to a device that outputs microwave supplied to a processing chamber. In particular, the present invention relates to a plasma processing apparatus and a microwave output device that form microwave using an oscillator, such as a magnetron, and supply the same to a processing chamber.

In the plasma processing apparatus for manufacturing a semiconductor device by processing a substrate-like sample, such as a semiconductor wafer, using plasma, a stable and high precision output of microwave is required. A magnetron is conventionally used for generation of such microwave.

A device for outputting such microwave typically includes a magnetron, a filament power supply for heating a filament of the magnetron, a high voltage power supply for oscillating and exciting the magnetron. However, the output efficiency of a magnetron differs depending on its use condition and furthermore a magnetron also has an individual difference, and therefore in order to obtain a high precision and stable output, a detector for detecting a microwave output is provided on the output side of a magnetron and a microwave output monitor signal obtained by this detector is fed back to a high voltage power supply to control the output of the high voltage power supply, thereby adjusting the magnitude of the output to within a predetermined value range.

As the examples of such a related art, the disclosures in JP-A-01-232727, JP-A-2000-294396, JP-A-2011-103270, and TECHNICAL REPORT OF IEICE SPS 2004-18(2005-02) are known. For example, JP-A-01-232727 discloses a technique for feeding back a signal obtained by monitoring the output of microwave to a high voltage power supply and controlling the output of this high voltage power supply.

JP-A-2000-294396 discloses a technique, wherein in order to realize a high speed response in automatic matching of microwave, a monitor signal is fed back to a high voltage power supply to control the output of the high voltage power supply, and on the other hand when a reflection electric power is high, an anode current monitor signal is temporarily fed back to control the output of the high voltage power supply. JP-A-2011-103270 discloses a technique for detecting the moding of a magnetron from a signal, which is obtained by monitoring an anode current, and controlling the output of a high voltage power supply. TECHNICAL REPORT OF IEICE SPS 2004-18(2005-02) describes an output fluctuation called a parasitic oscillation.

SUMMARY OF THE INVENTION

The above-described related arts do not fully take into consideration the following points, and thus pose a problem.

That is, as the first problem to be solved in the related arts, the response to detect the output of microwave is poor and thus the output of microwave will fluctuate with respect to a disturbance having a cycle shorter than this response speed or than a lapse time required for detection.

For example, for a ripple that could not be completely removed in a primary rectification smoothing circuit of a high voltage power supply, when a time lag in the response of a detector for detecting the output of microwave is larger than the cycle of the ripple and the response speed is too slow, the ripple cannot be removed and this ripple will be output as the ripple in the microwave output as it is. In order to remove or suppress this ripple, the response of the detector of the output of microwave needs to be improved or a large coil or condenser needs to be used for the primary rectification smoothing circuit. However, in the latter case, the manufacturing cost of the detector or the volume and the mounting area of the high voltage power supply will increase. Moreover, even if the ripple is suppressed using a large coil or condenser, there is no measure to suppress a fluctuation exceeding the response speed of the detector, and therefore it is difficult to substantially reduce the fluctuation in the microwave output caused by the ripple.

As the second problem to be solved, an abnormal oscillation of a magnetron called "moding", which is a conventional problem to be solved, needs to be suppressed. When the moding occurs, a short lasting and steep current will flow in a magnetron, which might damage the magnetron and a high voltage power supply.

As the third problem to be solved, an output fluctuation of a magnetron called a "parasitic oscillation" needs to be suppressed. This output fluctuation is the output fluctuation caused by the magnetron itself. In the related art as in JP-A-01-232727, this output fluctuation affects the detection result of a detector of the output of microwave, and based on the output result from the detector the output of microwave is adjusted. Such a related art poses a problem that the more accurately the detection is performed, the more the output of microwave will fluctuate.

The present invention has been made in view of the above circumstances and provides a plasma processing apparatus and a microwave output device capable of accurately stabilizing the output of microwave and improving the processing accuracy.

The above-described purpose can be achieved by a plasma processing apparatus that forms plasma inside a processing chamber using microwave formed by a magnetron and processes a wafer arranged inside the processing chamber, or a microwave output device used for the plasma processing apparatus, the plasma processing apparatus or the microwave output device including: a high voltage power supply for supplying a high voltage power to the magnetron; and a detector for detecting a microwave output from the magnetron, wherein based on a result of comparing a signal, which is obtained by adding an output from the detector to an AC component of a current detected from an output of the high voltage power supply, with a setting value of the output of the high voltage power supply, the output of the high voltage power supply is adjusted.

With the microwave plasma processing apparatus and the microwave output device of the present invention, the fluctuation with respect to a ripple or other disturbance can be reduced and the damage to a magnetron and/or a high voltage power supply caused by the moding of the magnetron can be reduced. Moreover, the occurrence of moding and a parasitic oscillation can be detected and reported to a user or a host controller, and furthermore the adequate maintenance of a magnetron and a high voltage power supply can be performed and/or the processing at the occurrence of a parasitic oscillation can be stopped.

Other objects, features and advantages of the invention will become apparent from the following description of the embodiments of the invention taken in conjunction with the accompanying drawings.

DETAILED DESCRIPTION OF THE EMBODIMENTS

Hereinafter, embodiments of the present invention will be described with reference to the accompanying drawings.

The embodiments of the present invention include, as a unit configured to solve the above-described problems, a unit configured to feed back only an AC component of a monitor signal of an input current (hereinafter, referred to as an anode current) into a magnetron and control the output of a high voltage power supply. The anode current can be detected with a resistor and a differential amplifier. Even with respect to a rapid fluctuation having a short cycle, to which a detector for detecting the output of microwave with such a configuration can hardly respond, the output of a high voltage power supply can be controlled and the fluctuation can be suppressed.

Because a microwave output monitor signal from a microwave output detector is fed back in terms of a direct current, a constant microwave output can be obtained as conventionally.

Figure 5:
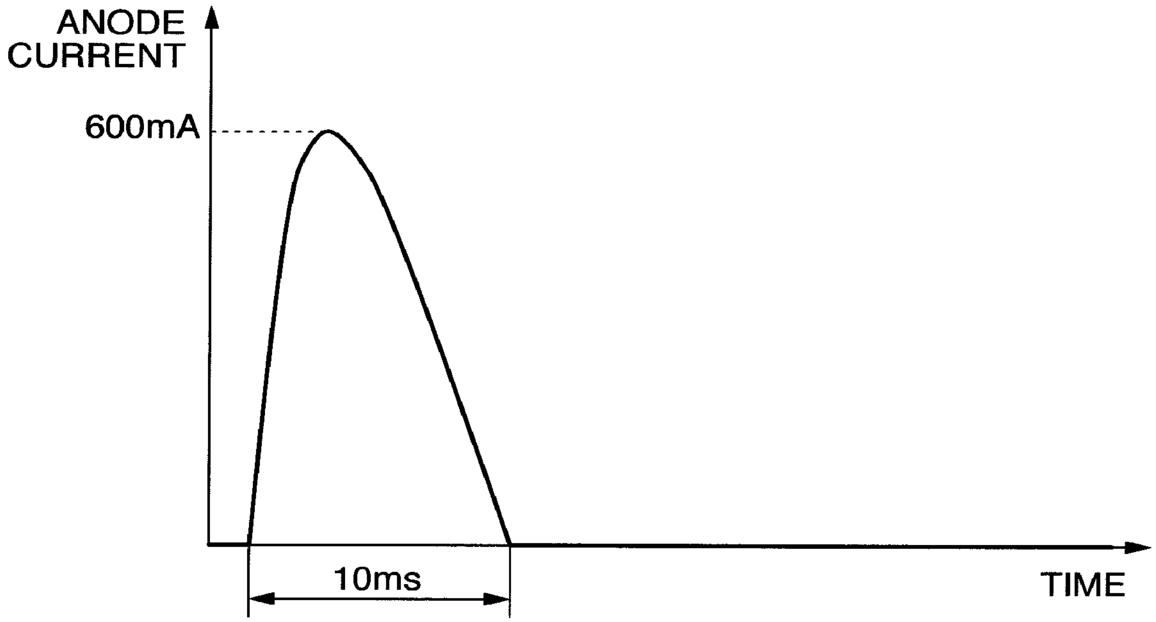
FIG. 5 is a view showing an example of the anode current at the occurrence of the moding of a magnetron.

Moreover, with respect to the moding that is the second problem to be solved, a steep current flowing into a magnetron at the occurrence of moding can be detected and the output of a high voltage power supply can be reduced. FIG. 5 shows a waveform of the anode current at the occurrence of moding. The anode current abruptly increases when the moding occurs, so by detecting this signal and reducing the output of the high voltage power supply, the anode current can be suppressed and the damage to the magnetron and the high voltage power supply can be reduced.

The AC component of the anode current may be detected and a resulting signal may be output to a host controller as an alarm signal. Even if the damage to the magnetron and the high voltage power supply at the occurrence of moding can be reduced with the microwave output device of the present invention, a certain degree of damage is assumed to be added. Therefore, using the above-described alarm signal, it is possible to urge a user to exchange or repair the magnetron and the high voltage power supply according to the number of occurrences of moding.

For the parasitic oscillation that is the third problem to be solved, as with the case of the above-described moding, the AC component of the anode current is detected and a resulting signal is output to a host controller as an alarm signal. At the occurrence of a parasitic oscillation, as described above, a problem arises that the measurement result of a microwave output detector is affected and as a result the output of microwave will shift. Therefore, in the plasma processing apparatus and the like, the processing needs to be stopped, and thus by detecting the AC component of the anode current and outputting a resulting signal to a host controller as an alarm signal, the processing can be adequately stopped at the occurrence of a parasitic oscillation.

As an alternative unit configured to solve the above-described problems, the output of a high voltage power supply has been conventionally controlled by a difference between an output setting signal and a microwave output monitor signal, while in the present invention, the output of a high voltage power supply is controlled after calculating a difference between an output setting signal and a microwave output monitor signal and then calculating a difference between the above difference and a monitor signal of the anode current.

A plasma processing apparatus or a microwave output device having such a configuration can control the output of a high voltage power supply even with respect to a rapid fluctuation, to which a microwave output detector can hardly respond, and suppress the fluctuation, by adding a monitor signal of an anode current in controlling the output of the high voltage power supply.

Moreover, because the output of the high voltage power supply is controlled so that eventually the difference between the output setting signal and the microwave output monitor signal from the microwave output detector becomes zero or becomes a value almost approximated to zero, a stable microwave output can be obtained.

Embodiment 1

Figure 1:
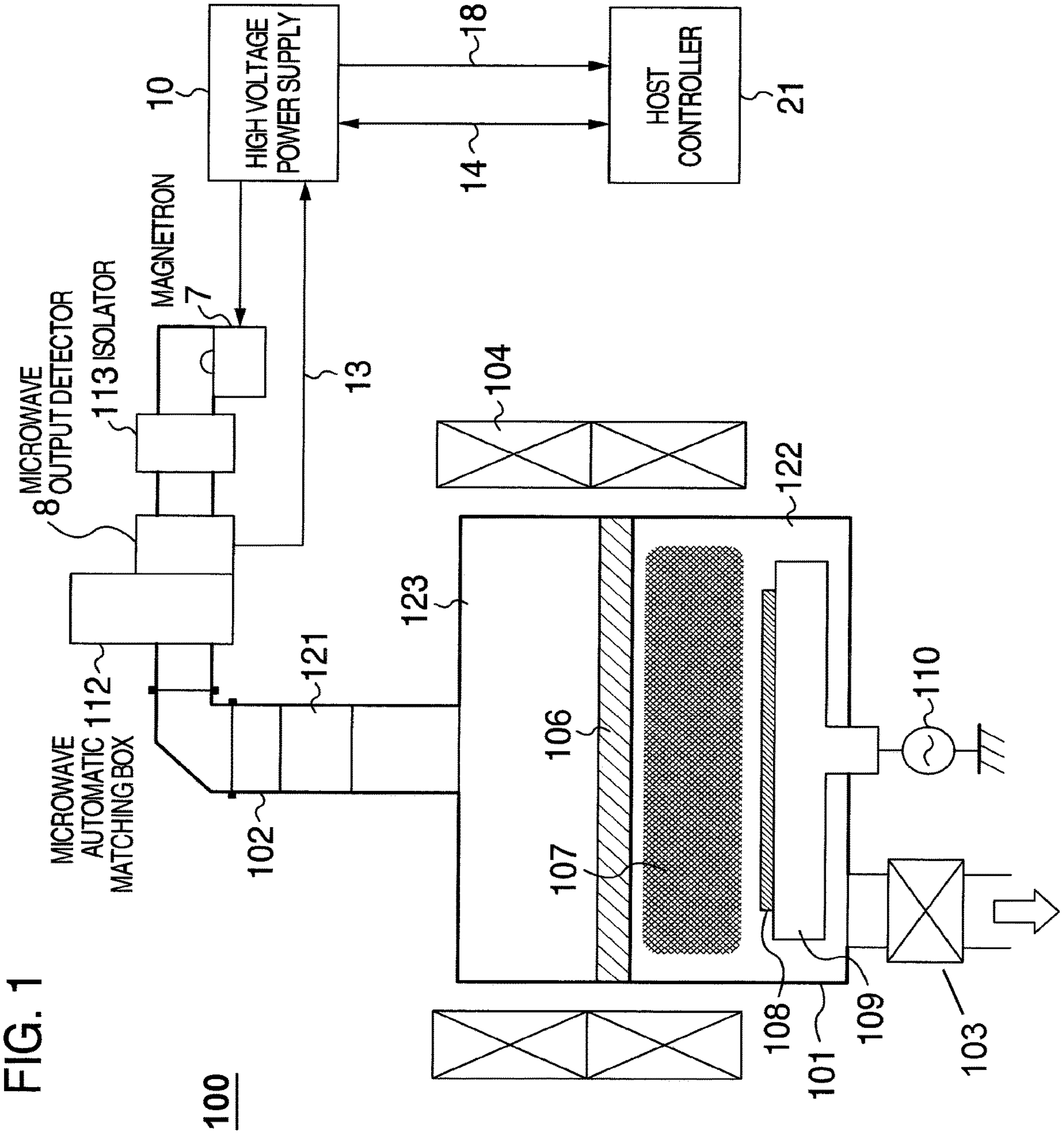
FIG. 1 is a vertical cross-sectional view schematically showing an outline of the configuration of a plasma processing apparatus according to an embodiment of the present invention.

Hereinafter, embodiments of the present invention will be described using the accompanying drawings. FIG. 1 is a vertical cross-sectional view schematically showing an outline of the configuration of a plasma processing apparatus according to an embodiment of the present invention.

The plasma processing apparatus of the embodiment supplies microwave into a processing chamber inside a vacuum container to form plasma, and etches a film structure in an upper surface of a substrate-like sample, such as a semiconductor wafer, arranged inside the processing chamber, using this plasma. In particular, in the embodiment, a magnetic field from a magnetic field generator, such as a solenoid coil, is supplied into the processing chamber together with an electric field of microwave, and a processing gas introduced into the processing chamber is excited by ECR (electron cyclotron resonance).

A plasma processing apparatus 100 of the embodiment shown in FIG. 1 is roughly divided into: a vacuum container 101 having a processing chamber 122 arranged thereinside; an electromagnetic field supply unit configured to supply an electric field or a magnetic field for forming plasma inside the processing chamber 122, the electromagnetic field supply unit being arranged above the vacuum container 101; and an exhaust unit including a vacuum pump 103, such as a turbo-molecular pump, for exhausting gas and/or plasma particles inside the processing chamber 122 and decompressing the inside, the exhaust unit being arranged under the vacuum container 101. A microwave output device according to the embodiment constitutes the electromagnetic field supply unit.

The vacuum container 101 is a metal container with a cylindrical side wall having the cylindrical processing chamber 122 inside the cylindrical side wall. Although not illustrated, the side wall of the vacuum container is grounded and set to a predetermined electric potential.

In a circular upper end portion of the cylindrical side wall of the vacuum container 101, there is placed and arranged a microwave transmission member 106, i.e., a disc made of dielectrics, such as quartz, through which an electric field can transmit. A seal member arranged between the circular upper end portion and the microwave transmission member 106 is sandwiched by these, and hermetically seals between the processing chamber 122 and the atmosphere that is at an atmosphere pressure of the outside. The upper portion of the microwave transmission member 106 constitutes the electromagnetic field supply unit, and is a portion where microwave propagates toward the processing chamber 122.

The electromagnetic field supply unit includes: a cylindrical structure, such as a waveguide 102, inside which microwave propagates; and a portion being arranged in the cylindrical structure and adjusting the formation and propagation of microwave. At one end of a portion constituting an upper portion of the waveguide 102, the portion where the axis of a tube extends in the horizontal direction, a magnetron 7 oscillating and forming microwave is arranged. The magnetron 7 is electrically coupled to a high voltage power supply 10, and excites microwave by a high voltage applied from the high voltage power supply 10.

The excited microwave propagates and travels inside the upper portion of the waveguide 102 and along the axis direction extending in the horizontal direction (the horizontal direction in the view), and the output, phase, and the like of the excited microwave are adjusted by an isolator 113 and a microwave automatic matching box 112, which are sequentially arranged along the travelling direction of microwave in a horizontal portion of the waveguide 102, and the excited microwave reaches the end of the horizontal portion. Note that, in the embodiment, between the isolator 113 and the microwave automatic matching box 112, a microwave output detector 8 for detecting the output of microwave propagating inside the waveguide 102 is arranged.

The other end of the horizontal portion is coupled to a portion that is a lower portion of the waveguide 102, the portion where the axis of the tube extends in the vertical direction. The horizontal portion of the upper portion of the waveguide 102 has a rectangular cross section, while the portion extending in the vertical direction is a cylindrical portion having a circular cross section. The cylindrical portion has a circularly-polarized wave generator 121, which rotates, with respect to the travelling direction, an electric field of microwave traveling from the above toward the bottom, and forms a circularly-polarized wave, arranged thereinside. Furthermore, the bottom end of the circularly-polarized wave generator 121 is a tubular portion having a cylindrical shape with the same diameter as that of the cylindrical portion of the vacuum container 101, and is connected to a cavity resonator 123 that causes the microwave propagated into a cylindrical space to resonate in a specific mode.

To the center portion of the upper surface of a cylindrical metal member surrounding the space inside the cavity resonator 123, the bottom end of the waveguide 102 is connected, and the inside of the cavity resonator 123 and the inside of the waveguide 102 are connected to each other. Moreover, the bottom of the cylindrical space inside the cavity resonator 123 is constituted by the upper surface of the microwave transmission member 106. At least a part of the microwave introduced into the cylindrical cavity portion 123 is reflected inside a cylindrical space between the bottom constituted by the microwave transmission members 106 and the ceiling surface made from a metal member constituting the cylindrical cavity portion 123, and reciprocates and resonates to form an electric field of a specific mode.

The electric field of microwave set to a specific mode in this manner is introduced into the processing chamber 122 through the microwave transmission member 106. The vacuum container 101 is connected to a non-illustrated gas supply line through which a processing gas passes, and the processing gas is supplied into the processing chamber 122 through a plurality of through-holes that are pre-formed in the center of a non-illustrated circular shower plate arranged on the lower surface side of the microwave transmission member 106.

Moreover, in a portion that is an outer periphery of the cylindrical portion of the vacuum container 101 or the side wall of the cavity resonator 123, the portion surrounding the above-described cylindrical portion or side wall, or in a portion above the cavity resonator 123, the portion surrounding the waveguide 102, a magnetic field coil 104, such as a solenoid coil, is arranged and forms a magnetic field by a DC power supplied. The static magnetic field excited by the magnetic field coil 104 and the electric field of microwave create an interaction by ECR, and the atoms and molecules of the processing gas supplied from the above into the processing chamber 122 are excited to form plasma 107 inside the processing chamber 122.

Under the processing chamber 122, there is arranged a wafer stage 109, i.e., a sample stage, on the top surface of which a wafer 108 to be processed is placed and held. Inside the wafer stage 109, there is arranged an electrode, to which a high-frequency electric power is applied from an RF bias power supply 110. The high-frequency electric power is for forming a bias potential above the wafer 108 mounted in the top surface of the wafer stage 109 and thereby promoting anisotropy processing of a film structure for constructing a circuit of semiconductor devices pre-formed in the top surface of the wafer 108.

The inside of the processing chamber 122 is supplied with a processing gas that is introduced from the shower plate or an inert gas that is introduced instead of the processing gas while the processing is not implemented. At the same time, the inside of the processing chamber 122 is exhausted by the operation of a vacuum pump 109 connected to an opening arranged at a lower part of the processing chamber 122. By the balance between the above-described supply and exhaust, the inside of the processing chamber 122 is decompressed and maintained at the pressure of a predetermined value. For example, the pressure inside the processing chamber 122 during processing is maintained at several Pa or less, but it is maintained at several tens Pa to approximately 100 Pa while the processing is not carried out.

Note that, the operation of the magnetron 7, the magnetic field coil 104, the high voltage power supply 10, the RF bias power-supply 110, and the like of the plasma processing apparatus of the embodiment is adjusted by a command signal transmitted from a controller that is coupled thereto by a communication unit. In the embodiment, a host controller 21 is arranged, the host controller 21 receives, via an interface, a signal output from a unit, such as the microwave output detector 8, configured to detect the state of the operation of the plasma processing apparatus 100, and an arithmetic logical unit, according to a received result, reads a software stored in an internal storage device, calculates a command signal using an algorithm, and transmits the same via the interface.

In the embodiment, a microwave output monitor signal 13 that is a signal indicative of the value of a microwave output output from the microwave output detector 8 is input to the high voltage power supply 10, and is transmitted to the host controller 21 as the signal of a microwave output 14. In the host controller 2, the microwave output monitor signal 13 is compared with an output command value 11 which the host controller 21 calculated, and according to this result, the output of the high voltage power supply 10 is adjusted, thereby the output of the microwave from the magnetron 7 is adjusted so as to approaches the output command value 11. Moreover, in the high voltage power supply 10, only the AC component of the anode current monitor signal is fed back to control the high voltage output.

Moreover, the high voltage power supply 10 transmits an alarm signal 18, which is obtained by detecting the AC component of the anode current monitor signal, to the host controller 21. Upon receipt of the alarm signal 18, the host controller 21 regards this as the occurrence of moding or a parasitic oscillation, and stops a plasma etching process of the wafer 108 and reports this fact to a user.

Figure 2:
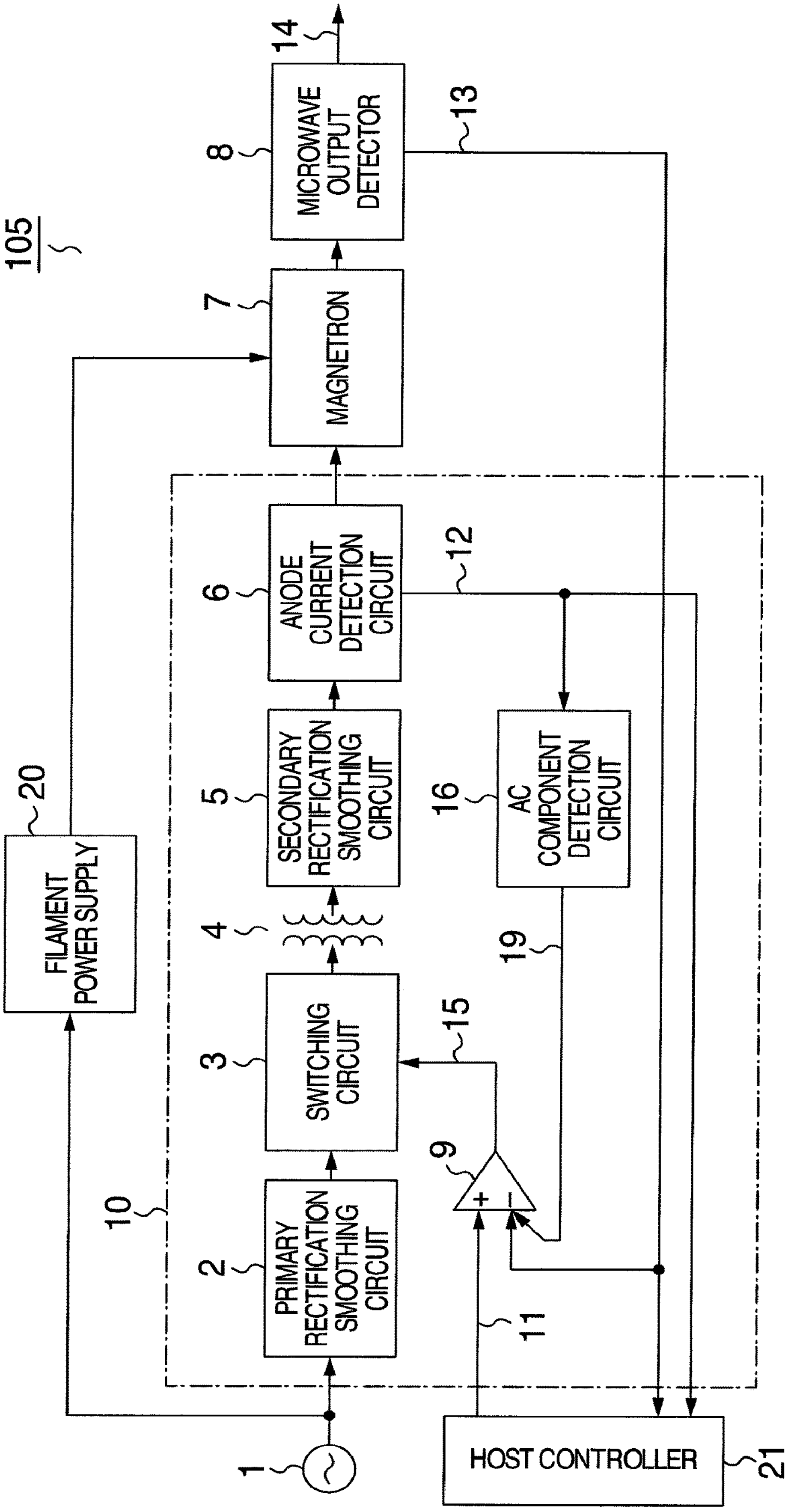
FIG. 2 is a block diagram schematically showing the configuration of a microwave output device of the plasma processing apparatus shown in FIG. 1.

FIG. 2 shows the configuration of the microwave output device according to the embodiment. FIG. 2 is a block diagram schematically showing the configuration of the microwave output device of the plasma processing apparatus shown in FIG. 1.

The microwave output device 105 shown in FIG. 2 includes the magnetron 7, the microwave output detector 8, the high voltage power supply 10, and the host controller 21 shown in FIG. 1, and a filament power supply 20. The microwave output device 105 is supplied with an electric power by the high voltage power supply 10 being electrically coupled to a commercial AC power supply.

The electric power from an AC power supply input 1 is input to a primary rectification smoothing circuit 2 constituting the high voltage power supply 10, and is also input to the magnetron 7 through a switching circuit 3, a boosting transformer 4, a secondary rectification smoothing circuit 5, and an anode current detection circuit 6 constituting the high voltage power supply 10. The magnetron 7 forms microwave at an output corresponding to the electric power from the high voltage power supply 10.

The output of the formed microwave is detected by the microwave output detector 8. The output from the microwave output detector is transmitted, so to speak "fed back", as the microwave output monitor signal 13 to the high voltage power supply 10 via a communication unit in order to be used in adjusting the output of the high voltage power supply 10.

The microwave output monitor signal 13 is input to an error amplifier 9 inside the high voltage power supply 10, and is compared, in the error amplifier 9, with an output command signal 11 indicative of a setting value transmitted from the host controller 21. An output control signal 15 set to a value corresponding to a difference between the microwave output monitor signal 13 and the output command signal 11 is transmitted to the switching circuit 3 from the error amplifier 9. The output of the high voltage power supply 10 is adjusted by the operation of the switching circuit 3 being adjusted according to the output control signal 15.

Figure 6:
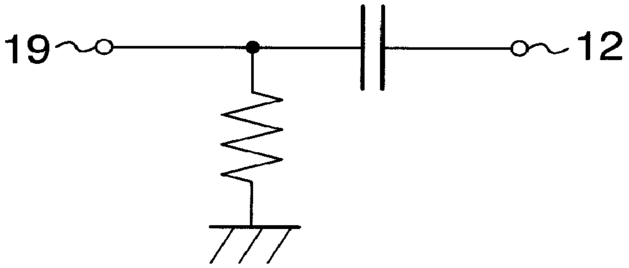
FIG. 6 is a circuit diagram showing the configuration of an AC component detection circuit 16 of the microwave output device according to the embodiment shown in FIG. 2.

The above-described configuration and operation are the same as those of the related art, however in the embodiment, inside the high voltage power supply 10, the anode current monitor signal 12 that is an output from the anode current detection circuit and indicates the anode current value is input to the error amplifier 9 via the AC component detection circuit 16. In the embodiment, the AC component detection circuit 16 has a relatively simple configuration by employing a circuit having a condenser coupled in series as shown in FIG. 6.

Figure 4A:
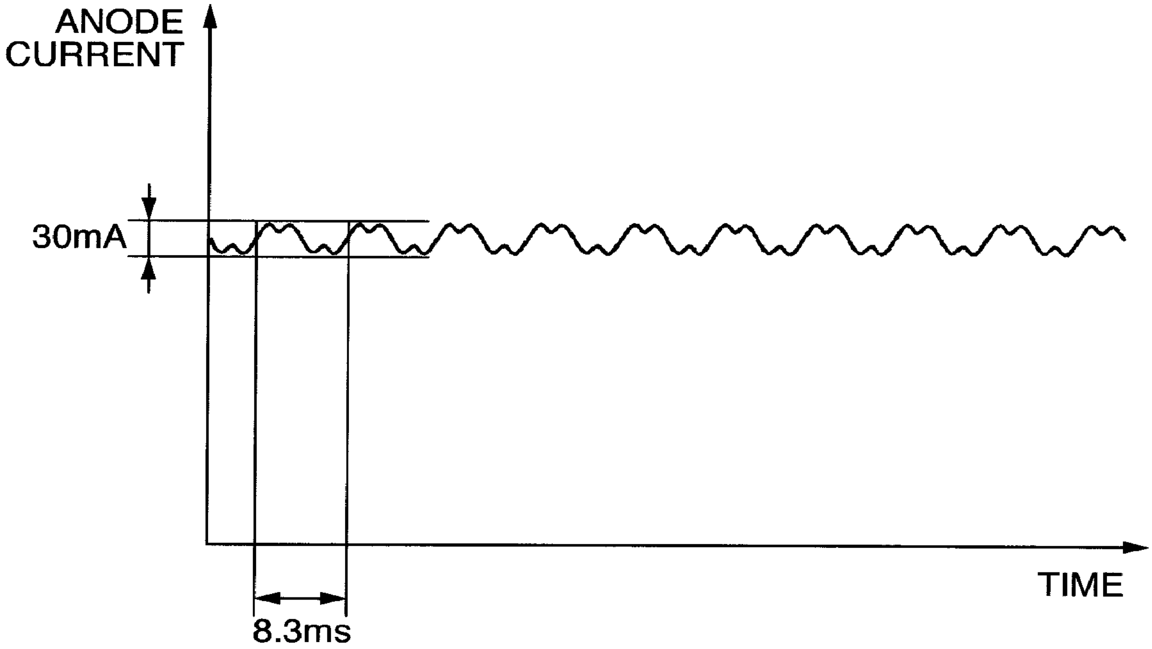
FIG. 4A is a graph showing an example of an anode current of a microwave output device according to a related art.
Figure 4B:
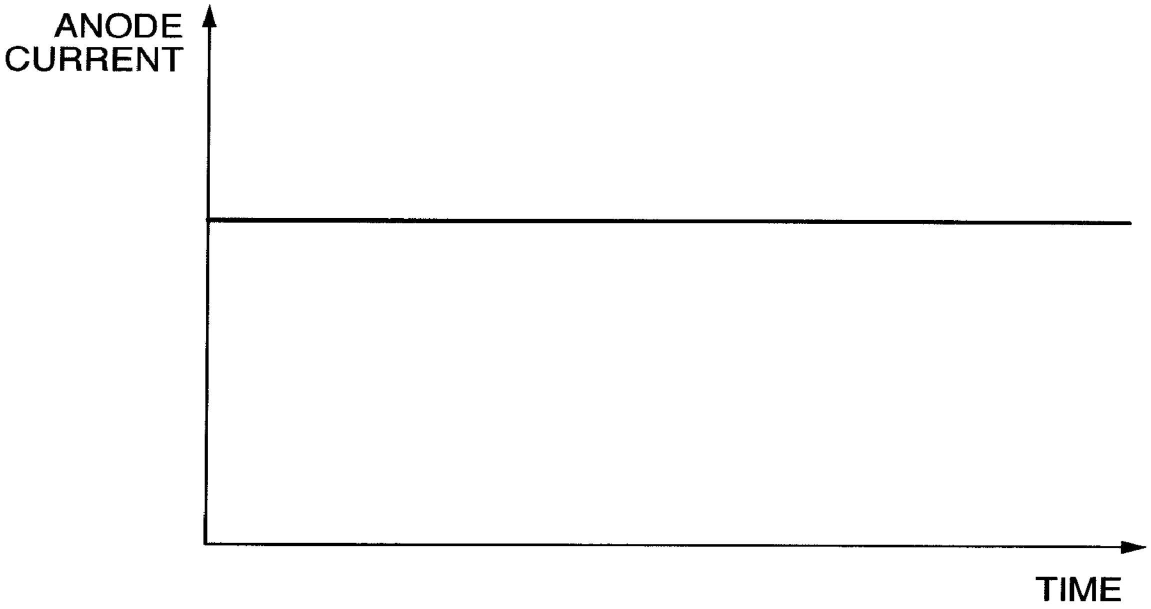
FIG. 4B is a graph showing an example of an anode current of the microwave output device according to the embodiment shown in FIG. 2.

FIGS. 4A and 4B are views showing an anode current waveform of a related art microwave output device and the microwave output device of the embodiment, respectively. In particular, FIGS. 4A and 4B are graphs showing an example of the anode current by the microwave output device according to the related art and the microwave output device according to the embodiment shown in FIG. 2, respectively.

These views show the magnitude value of the anode current as an output of the microwave output device. In the value of the output of the anode current of the microwave output device of the related art shown in FIG. 4A, a ripple is produced, the magnitude value of which increases and decreases with a change in time, at a short cycle, e.g., 8.3 ms in this example. With respect to the up and down in the output having such a short cycle, when the response to detect this change is slow, an output command signal capable of reducing such increase and decrease in the value cannot be transmitted, and thus the output from the magnetron 7 will increase and decrease by reflecting a fluctuation in the value of the anode current having a short cycle.

In the embodiment, the AC component of the anode current detected in the anode current detection circuit 6 is detected by the AC component detection circuit 16, and the resulting output is input to the error amplifier 9 together with the output detected by the microwave detector 8. In the error amplifier 9, the output command signal 11 input from the host controller 21 is compared with the microwave output monitor signal 13 from the microwave output detector 8 plus the AC component of the anode current monitor signal 12, and an output signal according to this difference is transmitted to the switching circuit 3.

An example of the anode current adjusted in this manner in the microwave output device of the embodiment is shown in FIG. 4B. In this view, the 120 Hz ripple generated in the microwave output device in the related art is suppressed in the microwave output device according to the embodiment and is set to a more constant and approximated value.

In the embodiment, such an AC component of the anode current, i.e., a fluctuation having a relatively short cycle of the anode current, is input to the error amplifier 9 as an error, and is input as a signal for correcting the output of the switching circuit 3, thereby responding to the fluctuation having a short cycle of the anode current that is reflected as the microwave output of the magnetron 7, so that the anode current can be set close to a desired value and set close to a more constant value. Therefore, the output from the high voltage power supply 10 can be adjusted and output to the magnetron 7, and the output of the magnetron 7 can be stabilized.

Variant 1

Figure 3:
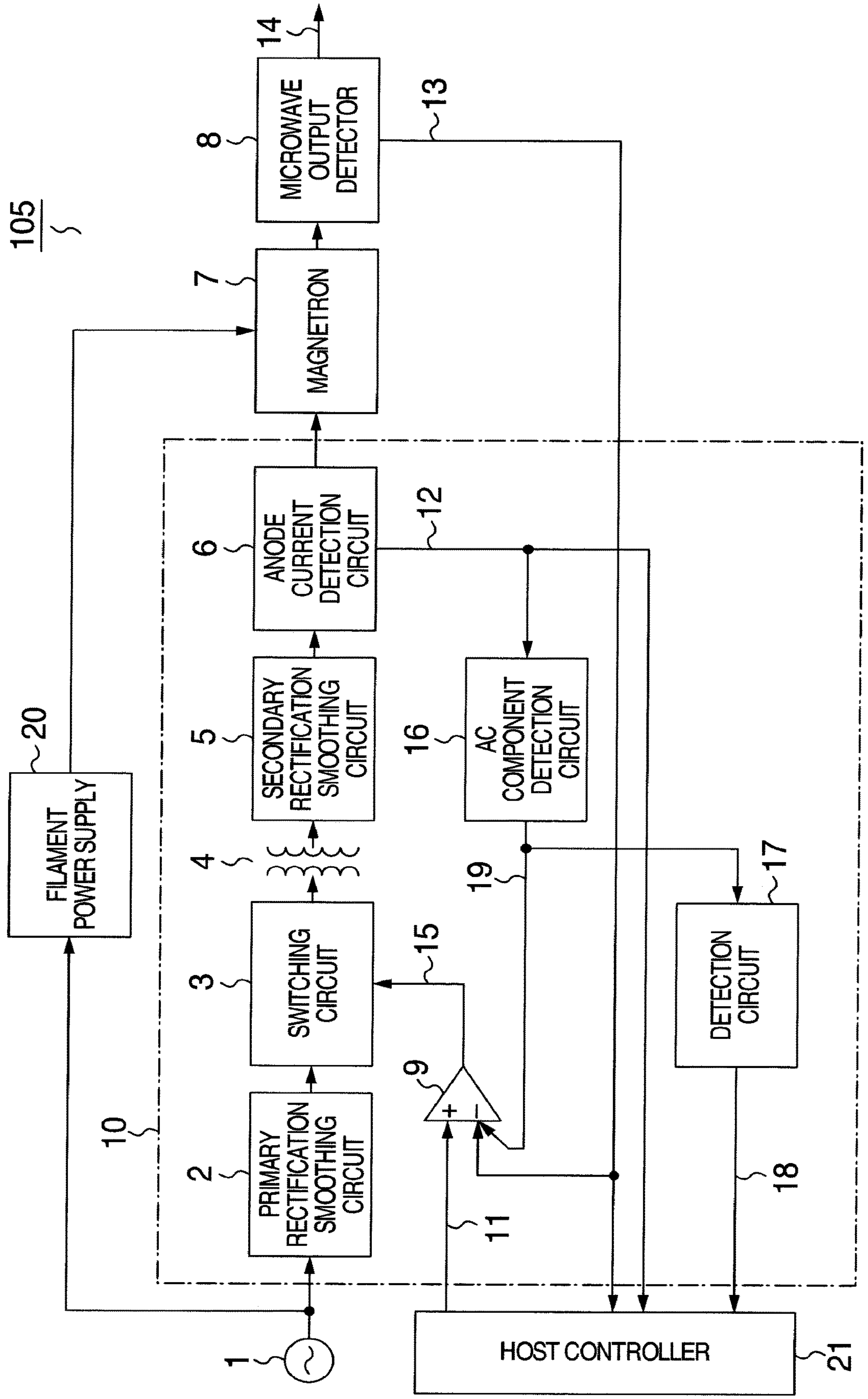
FIG. 3 is a block diagram showing a variant of the microwave output device according to the embodiment shown in FIG. 1.

A variant of the microwave output device is described using FIG. 3. FIG. 3 is a block diagram showing a variant of the microwave output device according to the embodiment shown in FIG. 1.

Figure 7:
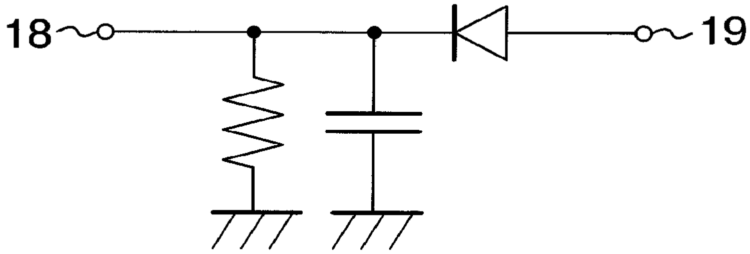
FIG. 7 is a circuit diagram showing the configuration of a detection circuit 17 of the microwave output device according to the embodiment shown in FIG. 3.

In the variant, in addition to the configuration of the embodiment shown in FIG. 2, a detection circuit 17 is arranged inside the high voltage power supply 10, and the output from the detection circuit 17 is transmitted to a host controller 21 as an alarm signal 18. In the variant, by inputting to the detection circuit 17 the AC component of the anode current that is the output of the AC component detection circuit 16, a fluctuation in the anode current generated at the occurrence of moding or a parasitic oscillation is output to the host controller 21 as the alarm signal 18. Note that the detection circuit 17 can be easily realized with a circuit using a diode and a condenser as shown in FIG. 7.

The host controller 21 that received the alarm signal 18 transmits a signal for stopping the operation of the magnetron 7 or the high-voltage line 10, thereby stopping the microwave output device. Moreover, it also transmits a signal for stopping the output of the RF bias power supply 110 and the output of the magnetic field coil 104 to eliminate the plasma 107 and at the same time reports the abnormality and the stop of the operation of the plasma processing apparatus 100 to a user.

Variant 2

Figure 8:
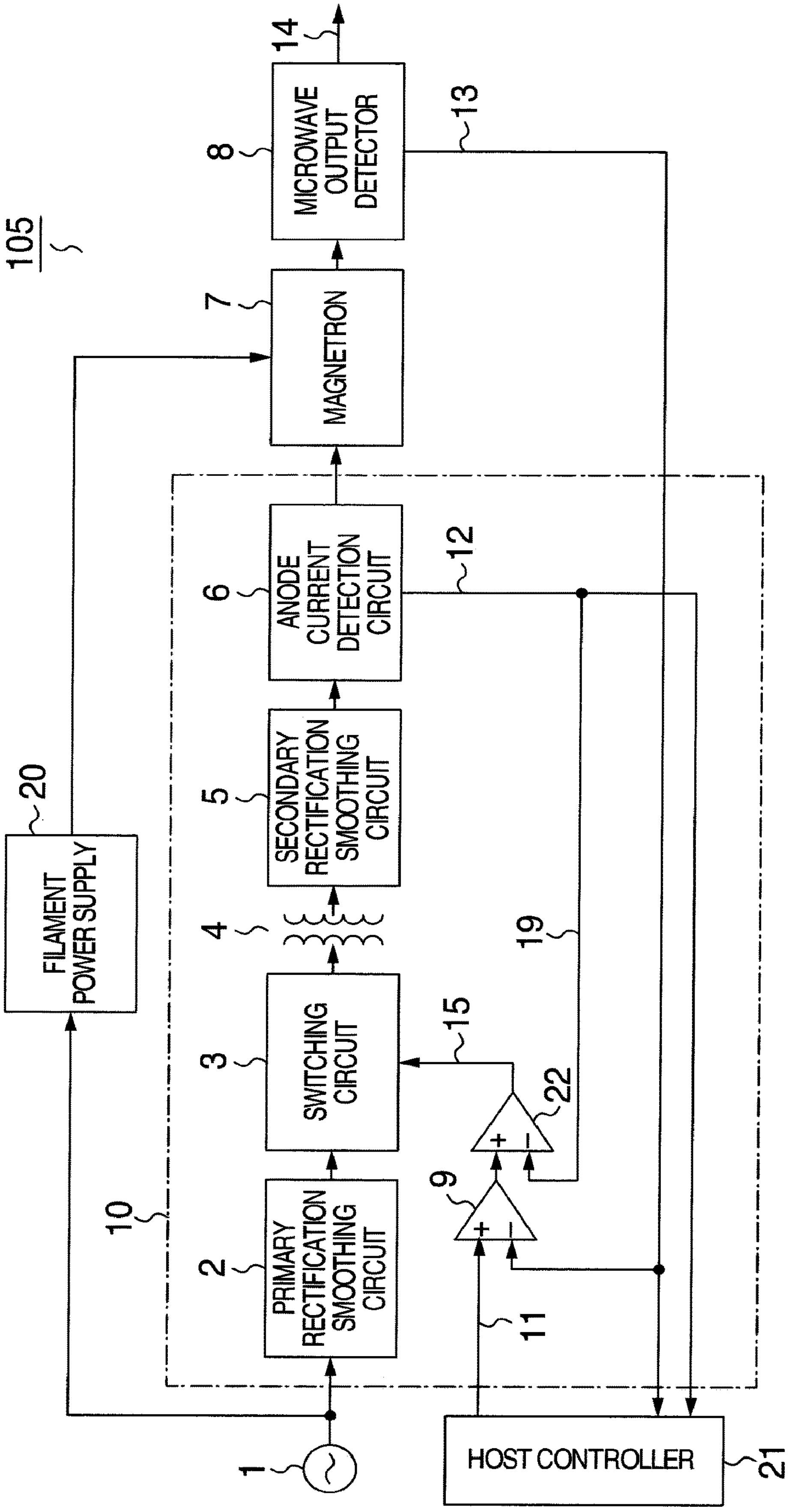
FIG. 8 is a block diagram schematically showing another variant of the microwave output device according to the embodiment shown in FIG. 2.

Using FIG. 8, another variant of the embodiment shown in FIG. 2 is described. FIG. 8 is a block diagram schematically showing another variant of the microwave output device according to the embodiment shown in FIG. 2.

The variant differs from the embodiment shown in FIG. 2 in that the output command signal 11 transmitted from the host controller 21 and the signal output from the microwave output detector 8 are input to the error amplifier 9 and a difference signal output from the error amplifier 9 is input to an error amplifier 22 together with the anode current monitor signal 12 and an output obtained as a result of comparing the difference signal output from the error amplifier 9 with the anode current monitor signal 12 is output to the switching circuit 3. That is, a difference signal between the signal output from the anode current error amplifier 22 and a signal indicative of a difference between the output command signal 11 and the actually-output microwave output is output to the switching circuit 3 as the output control signal 15, and the output of the high voltage power supply 10 is adjusted.

Also in this variant, the high voltage power supply 10 may include the detection circuit 17 shown in FIG. 3 that transmits the alarm signal 18 to the host controller 21.

Also in such a configuration, as with the embodiment of FIG. 2, the output from the high voltage power supply 10 is adjusted so as to reduce its fluctuation corresponding to a fluctuation having a short cycle in the anode current, the ripple in the output of the anode current that is the problem in the related art is suppressed, and the output of the anode current is set to a more constant and approximated value. Therefore, the output of the high voltage power supply 10 can be brought close to a desired value and brought close to a more constant value, and the output of the magnetron 7 can be stabilized.

According to the above embodiment and variants, because the output of microwave is stabilized, the characteristics, such as the electric potential and distribution, of the plasma formed in a processing chamber inside a vacuum container become more stable, so that a plasma processing apparatus or a microwave output device capable of improving the accuracy and/or repeatability of wafer processing can be provided.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method for processing a wafer arranged in a processing chamber inside of which a plasma is generated using microwave, the plasma processing method comprising:

supplying a high voltage power from a high voltage power supply to a magnetron;

generating the microwave using the magnetron;

supplying process gas into the processing chamber;

generating the plasma inside the processing chamber by using the exited process gas by the microwave propagated into the processing chamber;

wherein supplying a high voltage power further comprises:

detecting a microwave output from the magnetron;

detecting an AC component current in the high voltage power supplied to the magnetron;

comparing a first signal indicating a predetermined setting value for the high voltage power with a second signal which is obtained by adding the signal indicating the microwave output from the magnetron to the signal indicating the AC component current in the high voltage power, and adjusting the high voltage power supplied to the magnetron using a result of the step of comparing the first and second signals.

2. The plasma processing method according to claim 1, wherein detecting the AC component current comprises detecting the AC component current in the anode current which is output from the high voltage power supply to the magnetron.

3. The plasma processing method according to claim 1, the method further comprising:

outputting a signal obtained by detecting the AC component current in the high voltage power supplied to the magnetron as an alarm signal.

4. The plasma processing method according to claim 1, wherein adjusting the output of the high voltage power supplied to the magnetron includes adjusting the high voltage power supplied to the magnetron so that the difference between the first and second signals is reduced.

5. The plasma processing method according to claim 4, the method further comprising:

outputting a signal obtained by detecting the AC component current in the high voltage power supplied to the magnetron as an alarm signal.

6. The plasma processing method according to claim 1, the method further comprising:

rectifying an AC power from an AC power supply before detecting the AC component current, and wherein adjusting the high voltage power supplied to the magnetron includes adjusting the rectified AC power in the step of rectifying the AC power from the AC power supply.

7. The plasma processing method according to claim 3, the method further comprising:

rectifying an AC power from an AC power supply before detecting the AC component current, and wherein adjusting the high voltage power supplied to the magnetron includes adjusting the rectified AC power in the step of rectifying the AC power from the AC power supply.

8. The plasma processing method according to claim 4, the method further comprising:

rectifying an AC power from an AC power supply before detecting the AC component current, and wherein adjusting the high voltage power supplied to the magnetron includes adjusting the rectified AC power in the step of rectifying the AC power from the AC power supply.

9. The plasma processing method according to claim 5, the method further comprising:

rectifying an AC power from an AC power supply before detecting the AC component current, and wherein adjusting the high voltage power supplied to the magnetron includes adjusting the rectified AC power in the step of rectifying the AC power from the AC power supply.

10. The plasma processing method according to claim 2, the method further comprising:

outputting a signal obtained by detecting the AC component current in the high voltage power supplied to the magnetron as an alarm signal.

11. The plasma processing method according to claim 2, wherein adjusting the output of the high voltage power supplied to the magnetron includes adjusting the high voltage power supplied to the magnetron so that the difference between the first and second signals is reduced.

12. The plasma processing method according to claim 2, the method further comprising:

rectifying an AC power from an AC power supply before detecting the AC component current, and wherein adjusting the high voltage power supplied to the magnetron includes adjusting the rectified AC power in the step of rectifying the AC power from the AC power supply.

* * * * *